United States Patent
Sertel et al.

(10) Patent No.: US 9,490,280 B2
(45) Date of Patent: Nov. 8, 2016

(54) MINIATURE PHASE-CORRECTED ANTENNAS FOR HIGH RESOLUTION FOCAL PLANE THZ IMAGING ARRAYS

(71) Applicant: Ohio State University, Columbus, OH (US)

(72) Inventors: Kubilay Sertel, Hilliard, OH (US); Gokhan Mumcu, Tampa, FL (US)

(73) Assignee: Ohio State Innovation Foundation, Columbus, OH (US)

( * ) Notice: Subject to any disclaimer, the term of this patent is extended or adjusted under 35 U.S.C. 154(b) by 130 days.

(21) Appl. No.: 14/208,000

(22) Filed: Mar. 13, 2014

(65) Prior Publication Data

US 2014/0191351 A1 Jul. 10, 2014

Related U.S. Application Data

(63) Continuation of application No. 12/789,805, filed on May 28, 2010, now abandoned.

(60) Provisional application No. 61/181,809, filed on May 28, 2009.

(51) Int. Cl.
*G01J 5/00* (2006.01)
*H01L 27/146* (2006.01)
(Continued)

(52) U.S. Cl.
CPC ........ *H01L 27/14605* (2013.01); *G01J 1/4228* (2013.01); *H01L 27/14625* (2013.01); *H01Q 3/40* (2013.01); *H01Q 19/062* (2013.01); *H01Q 25/007* (2013.01); *G01J 5/0837* (2013.01)

(58) Field of Classification Search
CPC .................. H01L 27/14605; H01L 27/14625; H01Q 3/40; H01Q 25/007; H01Q 19/062; G01J 1/4228; G01J 5/0837

USPC ...................................................... 250/338.4
See application file for complete search history.

(56) References Cited

U.S. PATENT DOCUMENTS 5,490,013 A 2/1996 Shimizu et al.
6,037,590 A 3/2000 Boreman et al.
(Continued)

OTHER PUBLICATIONS

Filipovic et al., "Off-Axis Properties of Silicon and Quartz Dielectric Lens Antennas", IEEE Transactions on Antennas and Propagations, vol. 45, No. 5, May 1997.*
(Continued)

*Primary Examiner* — Laura Gudorf
(74) *Attorney, Agent, or Firm* — Meunier Carlin & Curfman LLC

(57) ABSTRACT

An imaging/detection device includes a hemispherical lens having a surface opposite a curvature of the hemispherical lens, where the hemispherical lens defines an optical axis. The imaging/detection device also includes a plurality of detectors arranged on a focal plane array that is positioned near the surface of the hemispherical lens. Each of the detectors respectively includes a diode and an antenna monolithically integrated with the diode. Additionally, at least one of the detectors is offset by a distance from the optical axis of the hemispherical lens and is configured such that a radiating pattern of the respective antenna is tilted by an angle and directed toward the optical axis of the hemispherical lens. A maximum direction of the radiating pattern of the respective antenna is related to the distance by which the detector is offset from the optical axis of the hemispherical lens.

14 Claims, 14 Drawing Sheets

(51) Int. Cl.
- *G01J 1/42* (2006.01)
- *H01Q 3/40* (2006.01)
- *H01Q 19/06* (2006.01)
- *H01Q 25/00* (2006.01)
- *G01J 5/08* (2006.01)

(56) References Cited

U.S. PATENT DOCUMENTS

| | | | |
|---|---|---|---|
| 6,590,544 | B1 | 7/2003 | Filipovic |
| 6,707,429 | B1* | 3/2004 | Siegel ............... H01Q 1/27 343/700 MS |
| 6,828,556 | B2 | 12/2004 | Pobanz et al. |
| 7,145,148 | B2 | 12/2006 | Alfano et al. |
| 7,449,695 | B2 | 11/2008 | Zimdars et al. |
| 7,583,074 | B1 | 9/2009 | Lynch et al. |
| 7,795,859 | B1 | 9/2010 | Lynch et al. |
| 7,796,080 | B1 | 9/2010 | Lynch |
| 7,989,842 | B2 | 8/2011 | Kazemi et al. |
| 8,098,185 | B2 | 1/2012 | Ridgway et al. |
| 8,154,439 | B2 | 4/2012 | Adlerstein |
| 8,350,747 | B2 | 1/2013 | DeLia et al. |
| 8,399,838 | B2 | 3/2013 | Evans et al. |
| 8,421,668 | B2 | 4/2013 | Ammar |
| 2007/0216594 | A1* | 9/2007 | Uno .................. H01Q 3/06 343/770 |
| 2008/0094296 | A1* | 4/2008 | Lee .................. H01Q 19/06 343/754 |
| 2009/0002220 | A1* | 1/2009 | Lovberg ............. G01S 13/89 342/33 |

OTHER PUBLICATIONS

Uehara et al., "Lens-Coupled Imaging Arrays for the Millimeter-and Submillimeter-Wave Regions", IEEE Transactions on Microwave Theory and Techniques, vol. 40, No. 5, May 1992.*

Ning Su, "High-Performance SB-Heterostructure Backward Diodes for Millimeter-Wave Detection and Imaging"; Apr. 2008.*

Gearhart, S.S., et al., "A monolithic 250 GhZ Schottky-diode receiver," IEEE Transaction on Microwave Theory and Techniques, vol. 42, No. 12, 1994, pp. 2504-2511.

Rahman, M.R.A., "Antenna-Coupled Tunnel Diodes for Dual-Band Millimeter Wave/Infrared Focal-Plane Arrays," dissertation, College of Electrical Engineering and Computer Science at the University of Central Florida, Orlando, Florida, 2004, 109 pages.

Su, N. "High-Performance SB-Heterostructure Backward Diodes for Millimeter-Wave Detection and Imaging," dissertation, University of Notre Dame, Graduate Program in Electrical Engineering, Notre Dame, Indiana, 2008, 149 pages.

Volkov, L.V., et al., "The arrays of GaAs antenna-coupled Schottky barrier diodes in millimeter wave imaging systems," Institute of Radioengineering and Electronics, Russian Academy of Sciences, Moscow, Russia, 1994, pp. 97-100.

* cited by examiner

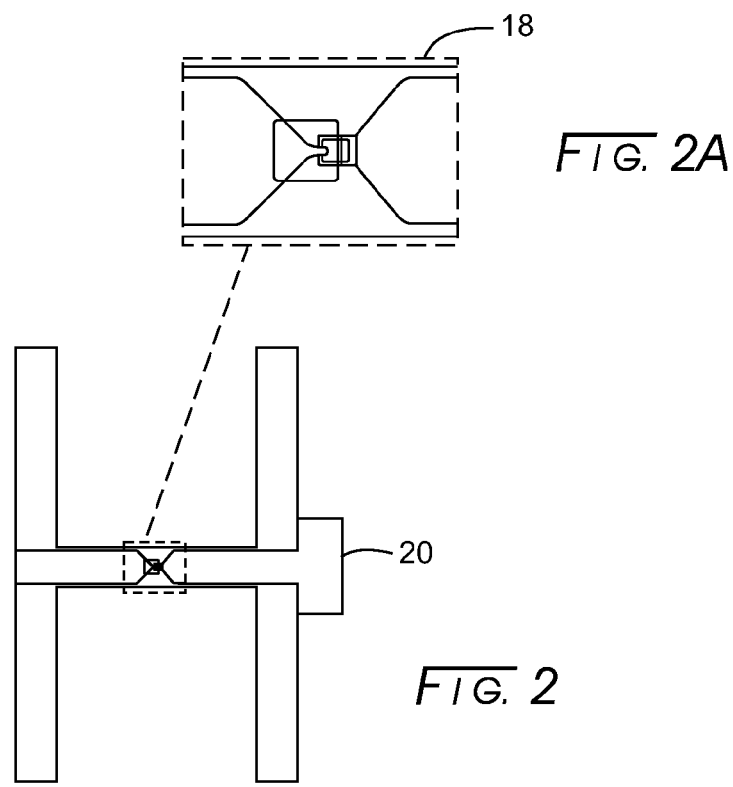
FIG. 2A
FIG. 2
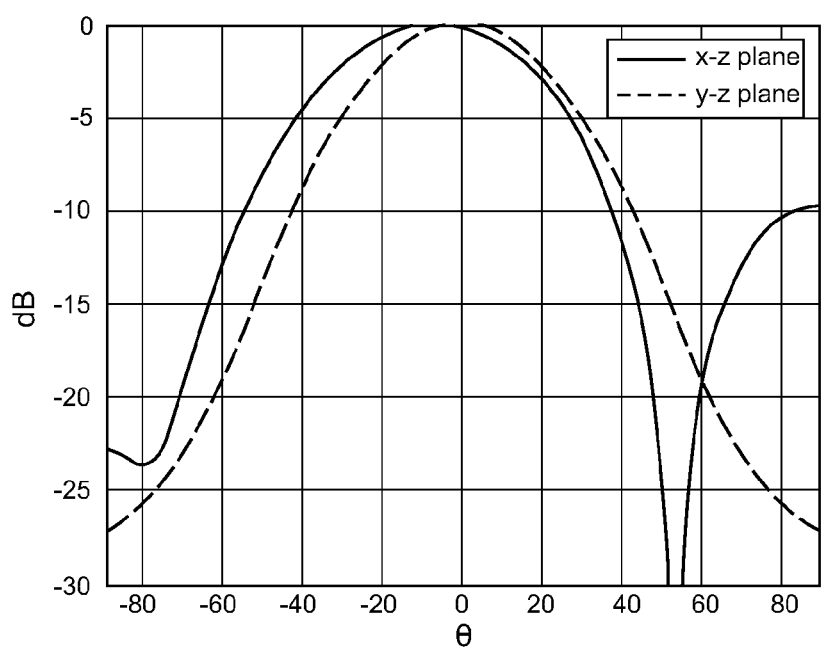
FIG. 3

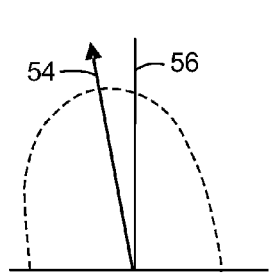
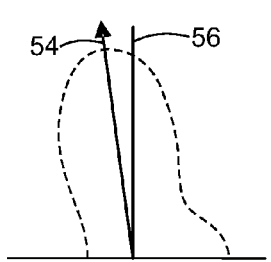
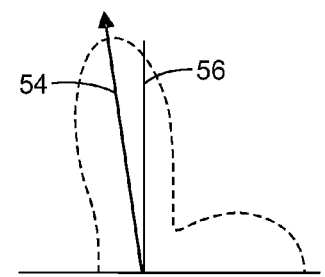
FIG. 23A        FIG. 23B        FIG. 23C
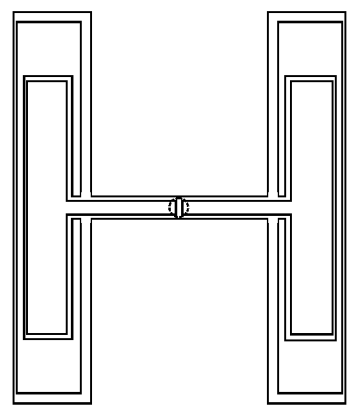
FIG. 24
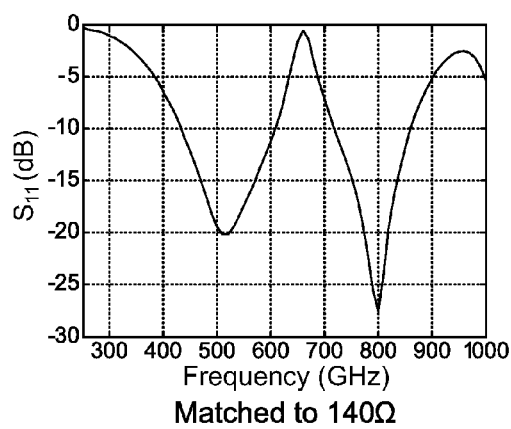
FIG. 25
Matched to 140Ω

MINIATURE PHASE-CORRECTED ANTENNAS FOR HIGH RESOLUTION FOCAL PLANE THZ IMAGING ARRAYS

CROSS-REFERENCE TO RELATED APPLICATIONS

This application is a continuation of U.S. patent application Ser. No. 12/789,805, filed on May 28, 2010, entitled "MINIATURE PHASE-CORRECTED ANTENNAS FOR HIGH RESOLUTION FOCAL PLANE THz IMAGING ARRAYS," which claims benefit of provisional application Ser. No. 61/181,809 filed on May 28, 2009 and entitled "Miniature Phase-Corrected Antennas for High Resolution Focal Plane THz Imaging Arrays", the disclosures of which are expressly incorporated herein by reference in their entireties.

STATEMENT REGARDING FEDERALLY SPONSORED RESEARCH

Not applicable.

BACKGROUND

Non-ionizing and penetrative nature of terahertz (THz) radiation makes it promising for various detection methods in the commercial and defense industry [1-2]. Likewise, in the medical scene, particular bands in the THz frequency regime can be identified as markers of malignant tissues. Tuned to these marker frequencies, THz radiation recently has been proposed as an effective tool for cancer detection that will exhibit satisfactory resolution, substantial penetration depth, and non-harmful radiation properties in contrast to the x-ray technology. This is especially true and important for the case of breast cancer with recently identified marker frequencies of 500 and 800 GHz. According to 2006 American Cancer Society surveillance research, one out of eight women will have breast cancer in their lifetime with 96% of these cases being curable if early detected. Moreover, real-time viewing and identification of the excised tissues during medical operation is highly desired in order to decrease the biopsy time and number of follow up operations.

Medical images using THz radiation typically are generated through a mechanical raster scan of the object. However, long image acquisition times associated with such a raster scan constitute a major bottleneck. Therefore, rapid THz imaging systems based on large arrays of sensitive detectors recently have been considered within the commercial and scientific communities. In the work disclosed herein, a focal plane imaging array topology with low noise and highly sensitive heterojunction detector diodes is developed. Specifically, we consider two major needs associated with the resolution of the THz imaging arrays constructed on extended hemispherical lenses. These needs include:
(1) Compact THz detector layout for tightly packed 2D focal plane imaging arrays. For example, Schottky diodes monolithically integrated within double slot antennas were previously employed in heterodyne THz detectors settings. Although these detectors are attractive in conjunction with the double slot antennas (because of their high Gaussian beam coupling efficiency and diffraction limited patterns [3]), the need for local oscillator signal and relatively large low-pass IF filter sections do not allow for tightly packed array development.
(2) Large number of antenna/detector elements (or equivalently pixels) without resorting to expensive and bulky lenses. When an extended hemispherical lens is used to focus the image on the array elements, reflections at the lens/air boundary significantly reduce coupling efficiency of the pixels positioned away from the lens axis. Therefore, the number of detector elements is significantly limited by the lens diameter, and cannot support imaging for scan angles beyond ±20° [4].

To alleviate these issues, in this disclosure, we disclose and verify a dual slot antenna element integrated with a zero-biased Sb-heterostructure backward diode for direct detection of THz radiation. In addition, we consider improved antenna layouts that can support tilted radiation patterns in order to increase the number of detectors without resorting to expensive and large silicon lenses.

A general discussion of HBD structures is set forth in U.S. Pat. No. 6,635,907. An improved version of such HBD is used in the present disclosure. In particular, the Sb-heterostructure backward diode of use in the present disclosure is an InAs/AlSb/GaSb backward diode having a p-type δ-doping plane with sheet concentration of $1 \times 10^{12}$ cm$^{-2}$ in the n-InAs cathode layer, as disclosed in the following references: N. Su, R. Rajavel, P. Deelman, J. N. Schulman, and P. Fay, "Sb-Heterostructure Millimeter-Wave Detectors With Reduced Capacitance and Noise Equivalent Power," *IEEE Electron Device Letters*, vol. 29, no. 6, pp. 536-539, June 2008; Su, Zhang, Schulman, and Fay, "Temperature Dependence of High Frequency and Noise Performance of Sb-Heterostructure Millimeter-Wave Detectors," *IEEE Electron Device Letters*, Vol. 28, No. 5, May 2007; Fay, Schulman, Thomas, Ill., Chow, Boegeman, and Holabird, "High-Performance Antimonide-Based Heterostruccture Backward Diodes for Millimeter-Wave Detection," IEEE Electron Device Letters, Vol. 23, No. 10, October 2002; and WO/2010/06966 published Feb. 22, 2010 (corresponding to PCT/US09/45288 filed on May 27, 2009). The disclosures of all of these references are expressly incorporated herein by reference.

Such preferred backward diodes as referenced immediately above can be described as a "cathode layer adjacent to a first side of a non-uniform doping profile, and an Antimonide-based tunnel barrier layer adjacent to a second side of the spacer layer having monolithically integrated antennas bonded thereto". The Antimonide-based tunnel barrier of such backward diodes may be doped. Such doping may be a non-uniform delta doping profile. This HBD, then, will be referred to herein as "a cathode layer adjacent to a first side of a non-uniform doping profile, and an Antimonide-based tunnel barrier layer adjacent to a second side of the spacer layer" for ease in discussion.

BRIEF SUMMARY

An array of backward diodes of a cathode layer adjacent to a first side of a non-uniform doping profile and an Antimonide-based tunnel barrier layer adjacent to a second side of the spacer layer have a monolithically integrated antenna bonded to each backward diode. The Antimonide-based tunnel barrier may be doped with, for example, a non-uniform delta doping profile. An imaging/detection device includes a 2D focal plane array of an array of backward diodes, wherein each backward diode is monolithically bonded to an antenna, which array is located at the back of an extended hemispherical lens, and wherein certain of the arrays are tilted for correcting optics aberrations. The antennas may be a bow-tie antenna, a planar log-periodic antenna, a double-slot with microstrip feed antenna, a spiral antenna, a helical antenna, a ring antenna, a dielectric rod antenna, or a double slot antenna with co-planar waveguide feed antenna.

BRIEF DESCRIPTION OF THE DRAWINGS

For a fuller understanding of the nature and advantages of the present device, reference should be had to the following detailed description taken in connection with the accompanying drawings, in which:

FIG. 2 is a fabricated dual slot antenna receiver for direct detection at 100 GHz;

FIG. 2A is an enlarged view of the fabricated dual slot antenna receiver of FIG. 2;

FIG. 3 graphically shows the calculated radiation into half-space silicon substrate;

FIGS. 23A-23C show receiving beams for the butterfly antenna of FIG. 21 at various frequencies;

FIG. 24 is a double folded slot antenna geometry for 500/800 GHz operation;

FIG. 25 graphically shows $|S_{11}|$←−10 dB bandwidth of the antenna when input impedance is matched to 140Ω;

These drawings will be described in further detail below.

DETAILED DESCRIPTION

THz Imaging System Overview

Figures 1, 1A, 1B:
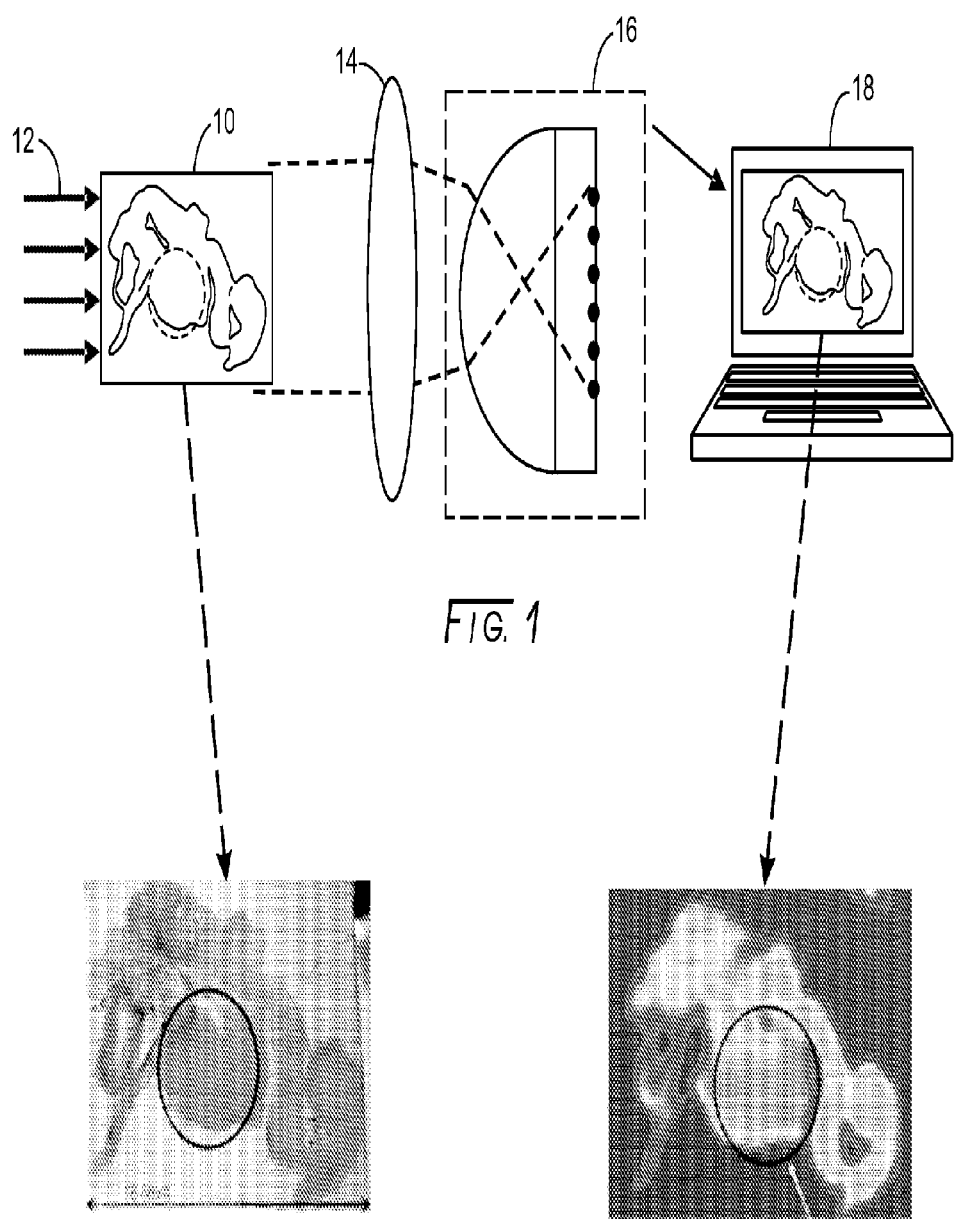
FIG. 1 is an overview of the disclosed THz imaging system illustrating THz source illumination, object lens, THz detector array, and digital processing.
FIG. 1A is an image of the object being imaged.
FIG. 1B is an image of the digitally processed image of the object.

FIG. 1 demonstrates an overview of the disclosed THz imaging system. The object (e.g., tissue sample), 10, that is to be imaged is illuminated with uniform THz radiation, 12. The transmitted waves that have amplitudes modified according to the absorption properties of the object are guided to the imaging array through a lens system, 14. The array elements are attached to the back of an extended hemispherical lens, 16, for detection from different angles of incidence. The lens is made from high resistivity silicon and its shape provides high gain and Gaussian beam coupling efficiency. Each focal plane array detector consists of a slot antenna structure (e.g., double slot) and Sb-heterostructure diode printed on it. The radiation received through the antenna is rectified on the diode, which acts as a half wave rectifier. The output of the rectification is DC voltage and higher frequency harmonics. The power level of the DC component corresponds to the magnitude of the received radiation. The detector subsequently is connected to an ND converter, which quantizes the DC voltage and determines the pixel contrast of the generated digital image, 18. Because each antenna-diode detector collects radiation from a specific direction, the ND converters measured voltage values form the pixels of a digital image (a.k.a., the image of the tissue under test. The critical design aspects for each detector element are the matching between the antenna and the diode, the absorption loss in the high resistivity silicon lens and the antenna aperture efficiency. All these losses and mismatches directly affect RF power transfer to the diode, thus decreasing the overall responsivity of the THz detector. FIG. 1A is an image of the actual tissue being imaged, while FIG. 1B is an image of the actual display of the imaged tissue.

Dual Slot Antenna Element for Direct Detection of THz Radiation

Figure 4:
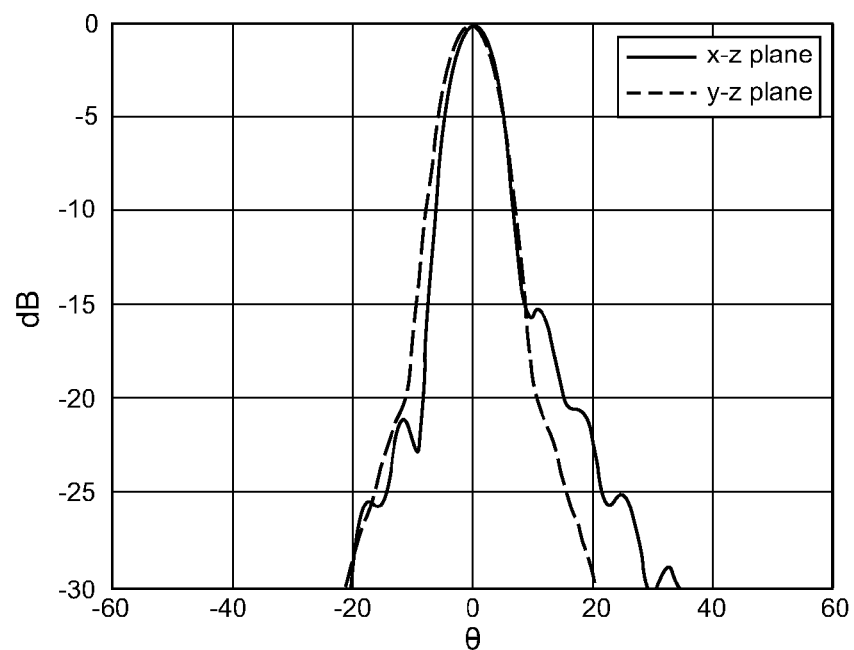
FIG. 4 graphically shows the calculated lens radiation pattern.

FIG. 2(a) depicts a magnified view of the fabricated detector, 18, with the dual slot antenna with the Sb-heterostructure [5] diode printed on it. The dual slot dipoles are designed to be 0.94 mm long, 0.08 mm wide, and 0.5 mm apart to resonate at 100 GHz. The slots are fed with a 0.1 mm wide coplanar waveguide (0.06 mm inner conductor width) leading to 10 GHz bandwidth on silicon half-space (50Ω impedance). The detector is attached to a 25 mm diameter extended silicon lens ($\in_r$=11.7) having a high resistivity of >10 kΩ. The diode area is adjusted to match 50Ω and a 5 mm extension length is chosen for operation close to the diffraction-limited directivity with large Gaussian coupling efficiency [6]. During the design process, radiation into the silicon half-space (FIG. 3) is evaluated via a method of moment (MoM) solution of the magnetic field integral equation. Subsequently, aperture currents on the lens are determined from a ray tracing technique, and then integrated to calculate radiation pattern of the overall system [6] (FIG. 4).

Figure 5:
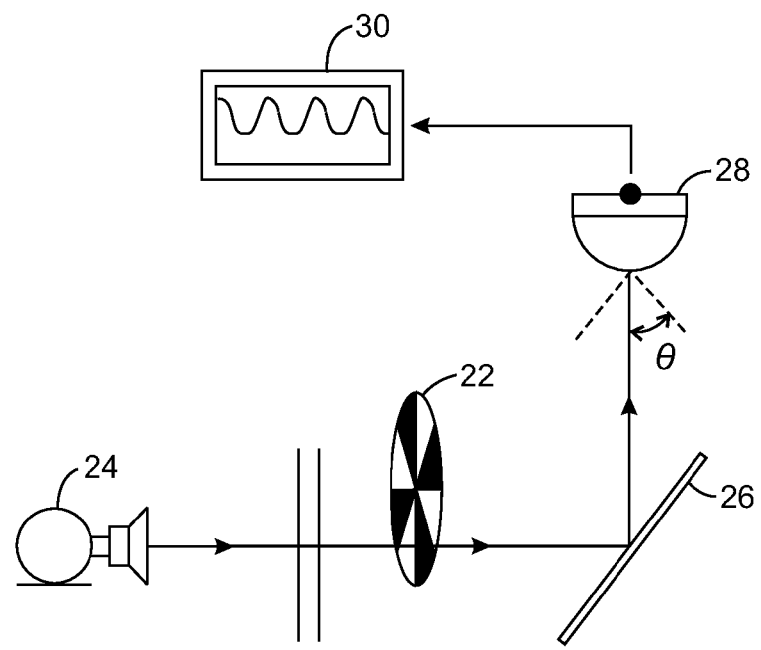
FIG. 5 is the measurement setup for 100 GHz using the fabricated dual slot antenna receiver of FIG. 2.

The received radiation is rectified by the zero-bias diode and converted to a DC voltage measured through a wire-bonded pigtail. A 0.1 mm×0.2 mm pad, 20, with 5 mm gap is formed adjacent to the antenna layout as depicted in FIG. 2(a) for wire bonding. Although the gap is very narrow as compared to the slot widths, its presence significantly affects the x-z plane radiation pattern. As shown in FIG. 3, the x-z plane half-power beam width (HPBW) is 8° wider than the y-z plane. Also, the x-z plane pattern is 8° tilted along −x and a −10 dB side lobe is observed towards +x. This pattern broadening is expected to decrease the Gaussian coupling efficiency and associated detector responsivity in an optically coupled imaging system. On the other hand, far field patterns in FIG. 4 are still very close to the diffraction limited size with 21 mm×21 mm effective aperture area (with only a 1° shift in the x-z plane). FIG. 5 depicts the experimental setup for testing the direct detection and Sb-heterojunction diode responsivity. A chopper, 22, rotating with a frequency of 341 Hz was mounted in front of the source horn of the backward wave oscillator, 24, radiating at 103.8 GHz. A mirror, 26, turns the beam towards a lens detector, 28, with readout provided by an oscilloscope, 30. Initial measurements resulted in a diode responsivity of 1000 V/W. New improved antenna designs presented below allow for realized responsivities exceeding 150,000 V/W.

Improved Off-Axis Detection with Asymmetrically Fed Miniature Slot Antennas

Figure 6A:
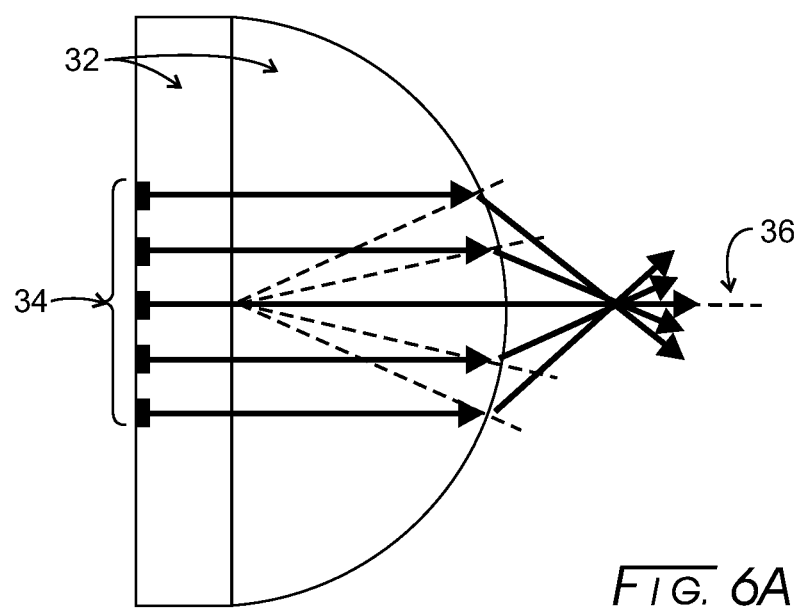
FIG. 6A is the ray tracing explanation of the imaging/detection by the 2D focal plane array at the back of an extended hemispherical lens.
Figure 6B:
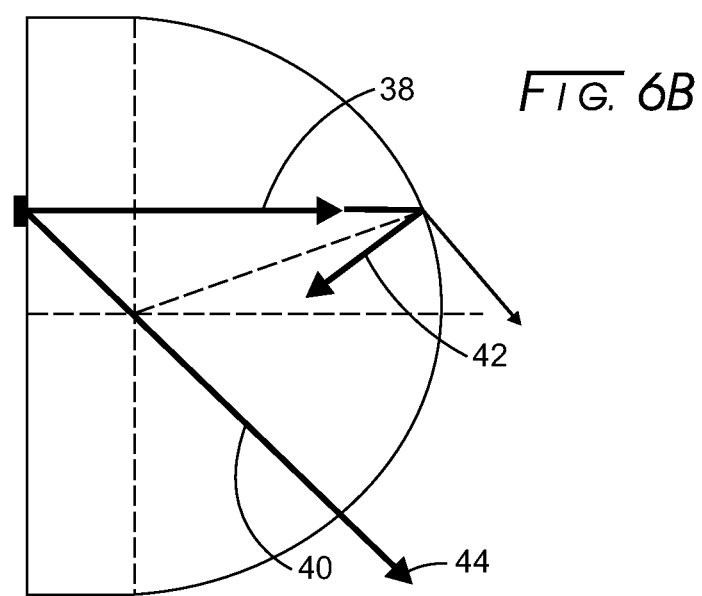
FIG. 6B illustrates the internal reflections at the lens/air surface for two different antenna layouts exhibiting different main beam directions; the tilted beam significantly decreases reflection loss at the lens/air boundary for off-axis detection.

The number of detectors, 34, used to form a focal plane-imaging array under the extended hemispherical silicon lens, 32, is limited by the internal reflections at the lens surface [4]. To illustrate this, let us consider the off-axis radiation properties of the dual slot antenna elements designed in the previous section. Since the slots are positioned symmetrically around the feed in the x and y directions, the antenna radiates a pencil beam into the silicon half-space along the positive z (θ=0°) axis, 36, with 10.9 dB directivity. From the ray optics illustration shown in FIG. 6A, it can be observed that the antennas radiate/detect along off-axis directions as they are positioned further away from the center element at the lens axis. Therefore, obtaining high-resolution THz images (i.e., large number of detectors) with a fixed size extended hemispherical lens implies detection from larger incidence angles. Although ray optics demonstrates that any off-axis detection is simply possible with an appropriate element location, antennas positioned further way from the lens axis experience significant power loss due to the reflections, 42, at the lens/air boundary. As shown in FIG. 6B, most of the radiation from the dual slot antenna element, 38, gets internally (42) reflected when the angle between lens surface normal and main beam direction increases.

Figure 10:
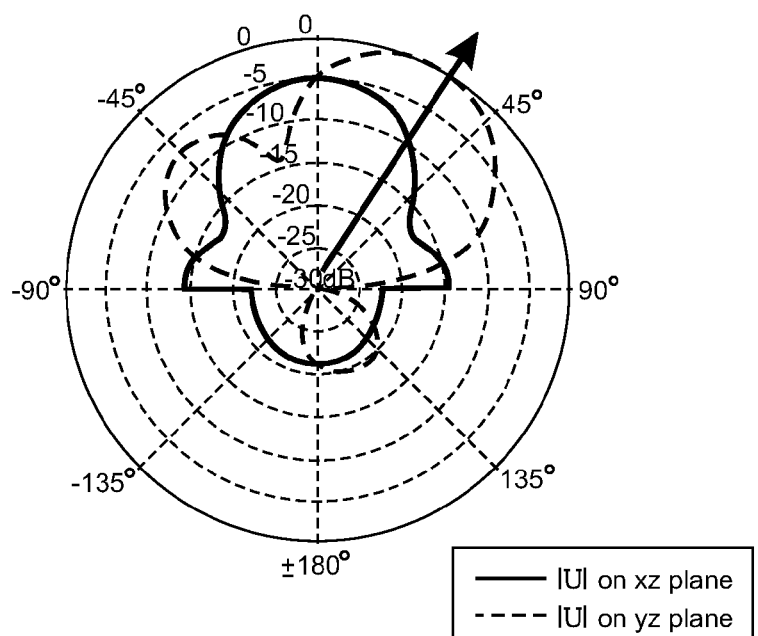
FIG. 10 is the resulting pattern using the dual slot detector layout of FIG. 0.

To alleviate this fundamental limitation and increase the number of allowable array elements for the same frequency and lens size, the disclosure proposes to minimize internal reflection using antenna structures, 40, with radiating patterns tilted towards the optical axis, 44, as shown in FIG. 6B. In the dual slot antenna configuration, 46, (see FIG. 7), such pattern tilting can be easily achieved via asymmetrical feeding or additional parasitic slots. For example, the half-space pattern of the antenna layout depicted in FIG. 8 is tilted 26° in the y-z plane towards +y direction. This tilting is simply achieved by moving the coplanar waveguide feed line 150 um along −y direction. The modified antenna element has a pencil beam with −7 dB side lobe level at 100 GHz and exhibits a real input impedance of 55Ω due to inductive loading applied around the feed position (see FIG. 10).

Figure 7:
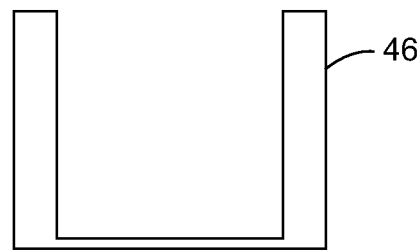
FIG. 7 is dual slot detector layout #1.
Figure 8:
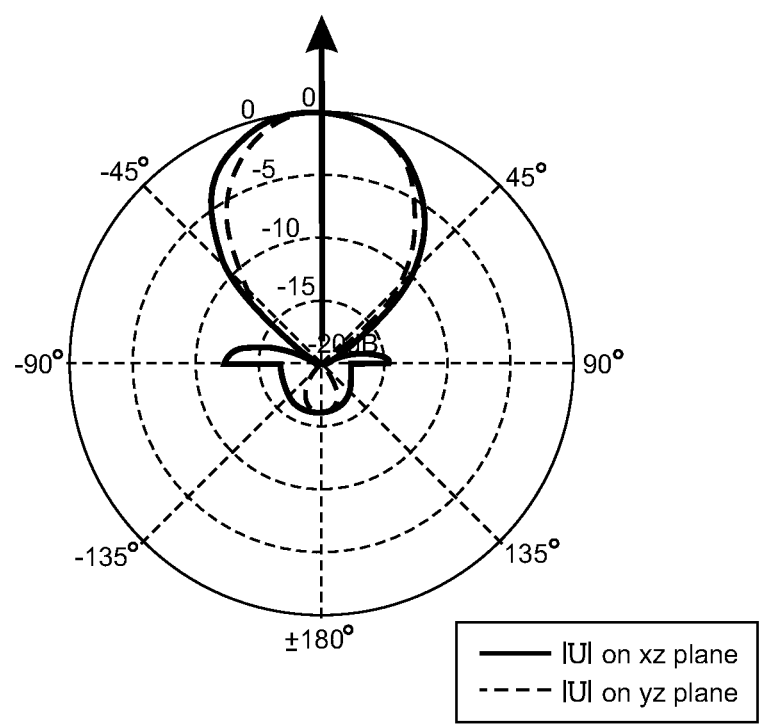
FIG. 8 is the resulting pattern using the dual slot detector layout of FIG. 7.
Figure 9:
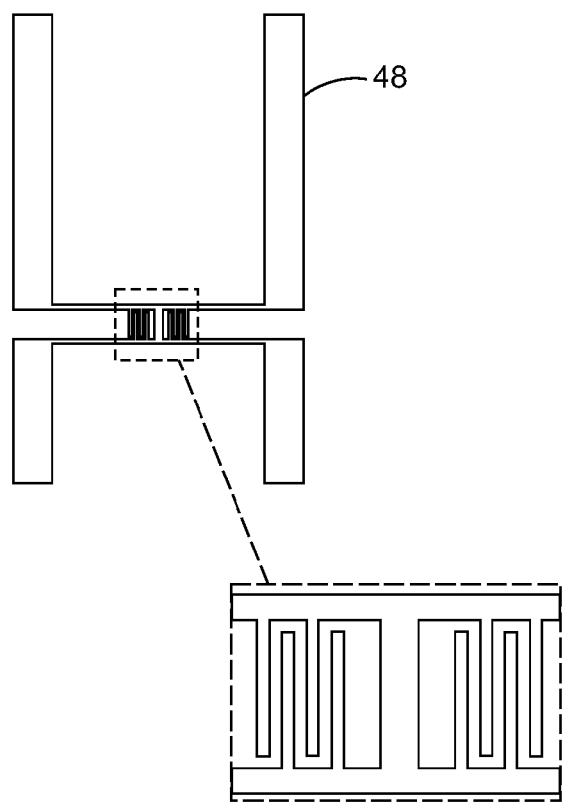
FIG. 9 dual slot detector layout #2 with the modified layout that supports 26° beam tilting for improved off-axis detection.
Figure 11:
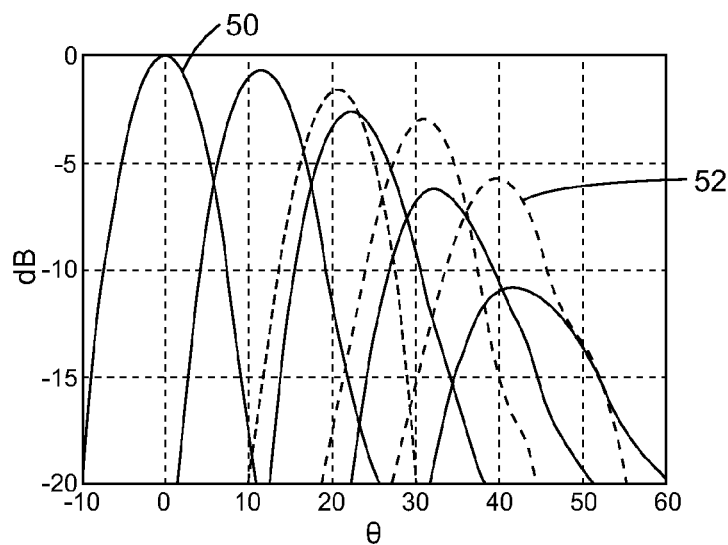
FIG. 11 graphically plots the calculated y-z plane lens radiation patterns when the detectors of FIGS. 7 and 9 are uniformly displaced off the lens axis with 1 mm intervals along the y-axis.

Solid lines, 50, in FIG. 11 depict the computed y-z plane radiation patterns when the original detector layout in FIG. 7 is displaced off-axis along −y direction with 1 mm intervals. These patterns are normalized with respect to the center element located at the optical axis. It is observed that for scan angles larger than 20° (off-axis distance >2 mm) a significant drop at the radiated power (←−6 dB) is observed. Therefore, 25 mm the silicon lens can only support 5 elements for a linear imaging array (2 along −y, center element, 2 along +y) and 13 elements (or equivalently pixels) for a rectangular 2D imaging array at 100 GHz (d<=2 mm, where d is the distance from the lens axis. The dashed lines, 52, in FIG. 11 demonstrate radiation patterns when detector layout, 48, in FIG. 9 is positioned at −2, −3, and −4 mm off the optical axis. Due to much reduced internal reflection, the elements receive 1 dB, 3.1 dB, and 4.8 dB more power, respectively. Hence, the 25 mm silicon lens can now support 4 more elements for a linear array configuration and 36 more elements (d≤4 mm) for a 2D imaging array as compared to the original configuration.

Figure 12:
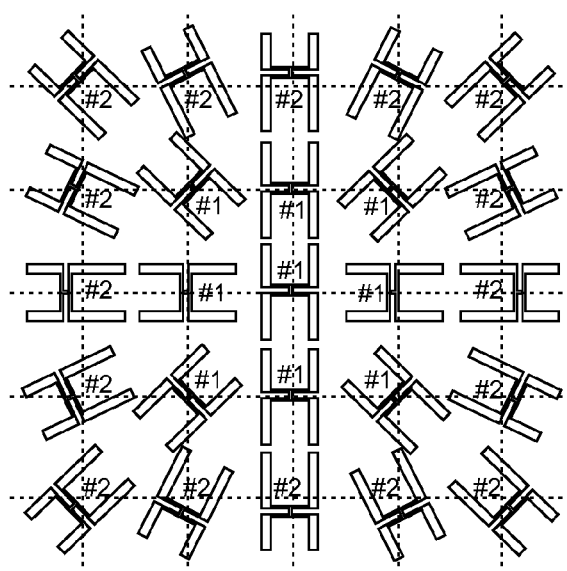
FIG. 12 shows an imaging array with two different layouts to improve the number of allowed pixels.

FIG. 12 depicts an illustration of a possible 2D array utilizing modified dual slot antenna elements. Due to different element orientations, a polarization scan is necessary for the best imaging performance. On the other hand, different types of modifications, such as feed location shift along x/y axes or parasitic slots, can be combined to tilt element patterns in an arbitrary cut without changing the antenna element.

Figure 13:
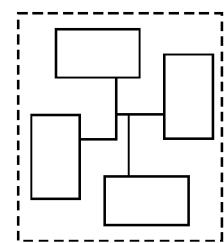
FIG. 13 is a detector consisting of multiple small antennas to support radiation beams tilted >25° off the lens axis.

However, beam tilting supported by asymmetrically fed double slot antennas turn out to be limited by 25°. In order to enable beam tilting beyond 25°, the detector must consist of multiple antennas as illustrated in FIG. 13. In addition the overall size of the detector layout must be kept smaller than the maximum pixel size dictated by the wavelength and lens, f-number. Hence, miniature antenna layouts and detector topologies as demonstrated in FIG. 13 alleviate these challenges and enable high-resolution THz focal plane imaging arrays that will work without expensive and large silicon lens optics.

Figure 14:
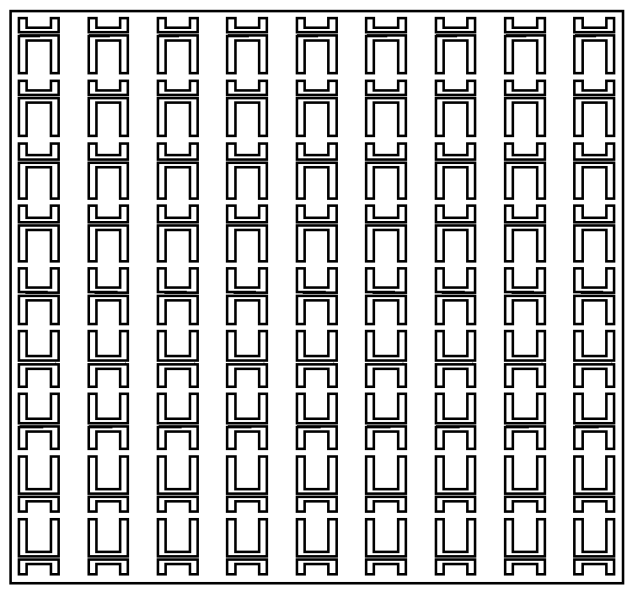
FIG. 14 is an exemplary layout of a pattern corrected double slot antenna FPA.
Figure 15:
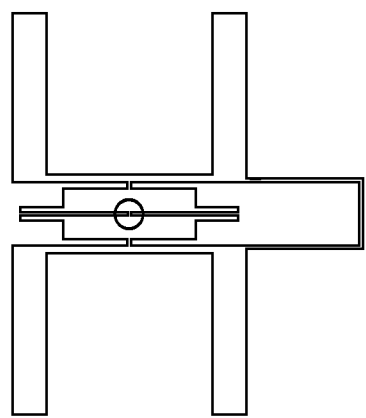
FIG. 15 is a double slot antenna layout unmodified.
Figure 16:
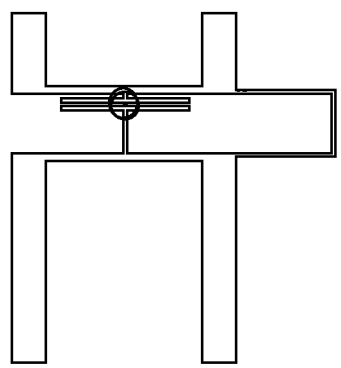
FIG. 16 is the double slot antenna layout of FIG. 15 modified.

Broadband Focal Plane Array Performance Enhancement Via Antenna Beam-Correction for THz Imaging Double slot antenna configuration is quite flexible for designs that can achieve excellent performance within a focal plane array (FPA) as seen in FIGS. 14-16. However, they exhibit narrow operation bandwidths. Thus, it is imperative to show that the pattern correction techniques (outlined above for double slot antennas) also are applicable for broadband antenna to correct for the off-axis element performance degradation due to refractions and wavefront aberrations.

Slot Spiral Antenna

Figure 17:
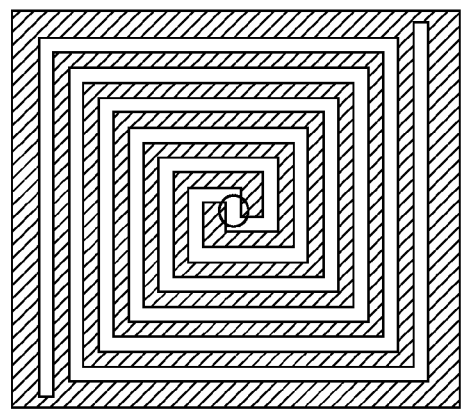
FIG. 17 is another slot spiral antenna layout unmodified.
Figure 18:
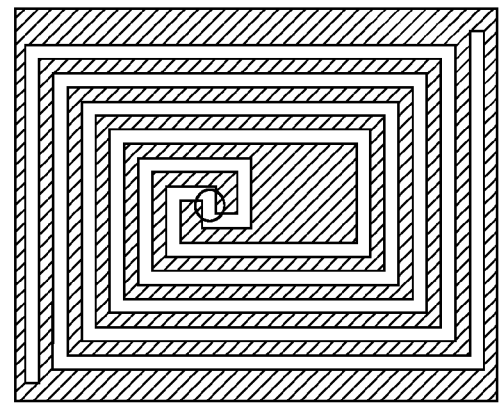
FIG. 18 is another double slot antenna layout of FIG. 17 modified.
Figure 19:
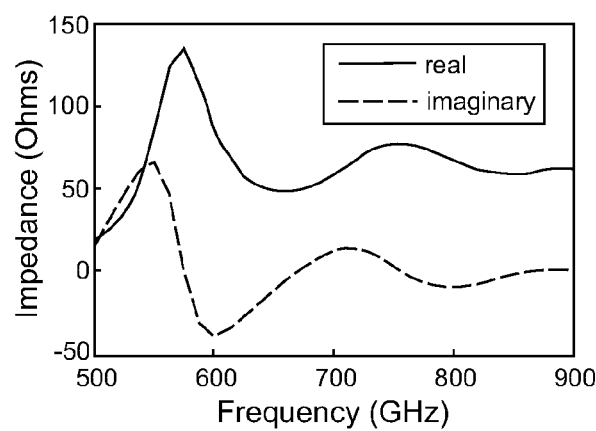
FIG. 19 graphically plots frequency (GHz) versus impendence (Ω) for a beam-tilted slot spiral antenna impedance.

The slot spiral antenna features broadband operation while maintaining a very small footprint. It is compact in size; thus, can easily be incorporated into a densely packed FPA. It exhibits a rather uniform radiation pattern throughout the operating frequency band. In FIGS. 17 and 18, the spiral antenna layouts for boresight (FIG. 17) and tilted beam (FIG. 18) reception are depicted. In order to tilt the receiving beam of the antenna, the feed (or the location of the detector element) was shifted off of the geometrical center and the horizontal slots were elongated. Also shown in FIG. 19 is the broadband impedance performance of the beam-tilted spiral element.

Figure 20:
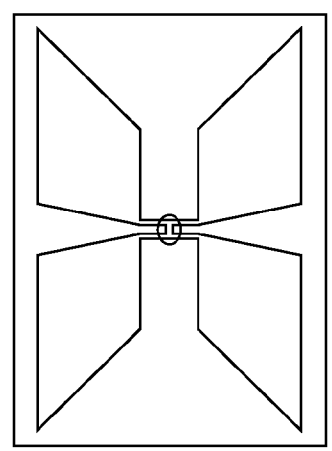
FIG. 20 is a broad double slot antenna layout unmodified.
Figure 21:
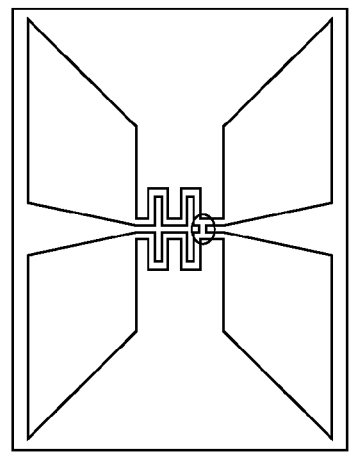
FIG. 21 a broad double slot antenna layout modified.

In addition to a spiral design, broadband performance also can be achieved by different antenna topologies, such as the one shown in FIGS. 20 and 21. This antenna is a modification of the double-slot antenna and is termed the "butterfly antenna" due to its appearance. The beam-correction technique applied to the butterfly antenna is outlined below.

Figure 22:
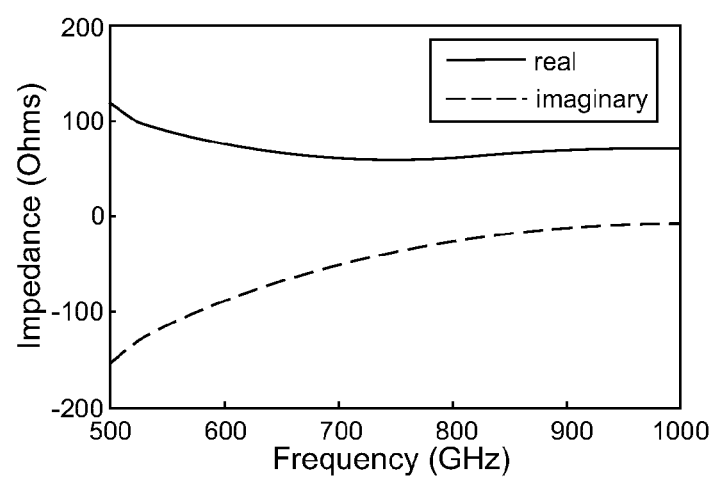
FIG. 22 graphically plots frequency (GHz) versus impendence (Ω) for broad double slot impedance.

The narrow bandwidth of the versatile double slot antenna can be improved by modifying the antenna slots as depicted in FIGS. 20 and 21. This design accommodates wideband around the center frequency. The resulting impedance performance of the butterfly antenna is shown in FIG. 22, displaying a much broader bandwidth covering the 500 GHz to 1 THz range. The antenna has a relatively uniform behavior in terms of both impedance and radiation pattern. As opposed to the broadband spiral antenna, the butterfly antenna layout features improved flexibility in controlling the beam-tilt angle throughout the operation frequency band. As seen in FIGS. 22A-22C, the feed (or detector), 54, is placed off the center, 56, closer to one of the two slots resulting in a phase difference between the currents in the two slots (as in the case of double slot antennas). However, for the lower frequencies phase difference is small meaning that the angle of the tilted beam also is small. Thus, adding meander section into the feed line (see FIG. 22) increases the electric length of the feeding line; thus, the phase difference.

The achievable beam tilts for the 500 GHz-1 THz bands are shown in FIGS. 23A-23C.

Miniature Slot Antennas for Multi Band THz Detection

As demonstrated in the previous section, focal plane THz imaging arrays (positioned at the back surface of an extended hemispherical lens) can employ small and directive slot antenna configurations in order to deliver the best detection performance in terms of sensitivity, loss, and resolution. That is, the antenna size must not be larger than that set by the diffraction limit of the lens aperture (1.22λf/D), while the pattern is directive and symmetric with respect to the lens axis. The size of the antenna element becomes even more critical at multiband applications to obtain the best possible resolution at the high frequency regime.

For our frequencies of interest (breast cancer detection) at 500 GHz and 800 GHz, this disclosure proposes the double folded slot antenna configuration shown in FIG. 24 as an initial design. Since folded slot length is about half of a regular slot, the 111 um×94 um resolution of the double folded slot antenna is very close to the optimal 85 um×85 um at 800 GHz. Both of the 500/800 GHz radiation patterns are symmetric and directive implying that individual radiators (i.e., inner and outer folded slots) can be excited without coupling and distorting each other. FIG. 25 demonstrates the $|S_{11}|<-10$ dB bandwidths of the antenna element at 500/800 GHz frequencies. Specifically, 15% bandwidth can be obtained when the antenna is matched to 140Ω.

Clearly, smaller slot antenna/detector topologies are highly beneficial for high-resolution focal plane THz imaging arrays that will employ multiband detection. In addition, enabling pattern tilting for these multiband antennas will result in higher resolution without resorting to large and bulky lenses, as was discussed in the above.

HBD Structures with Matched Antennas

Figure 26:
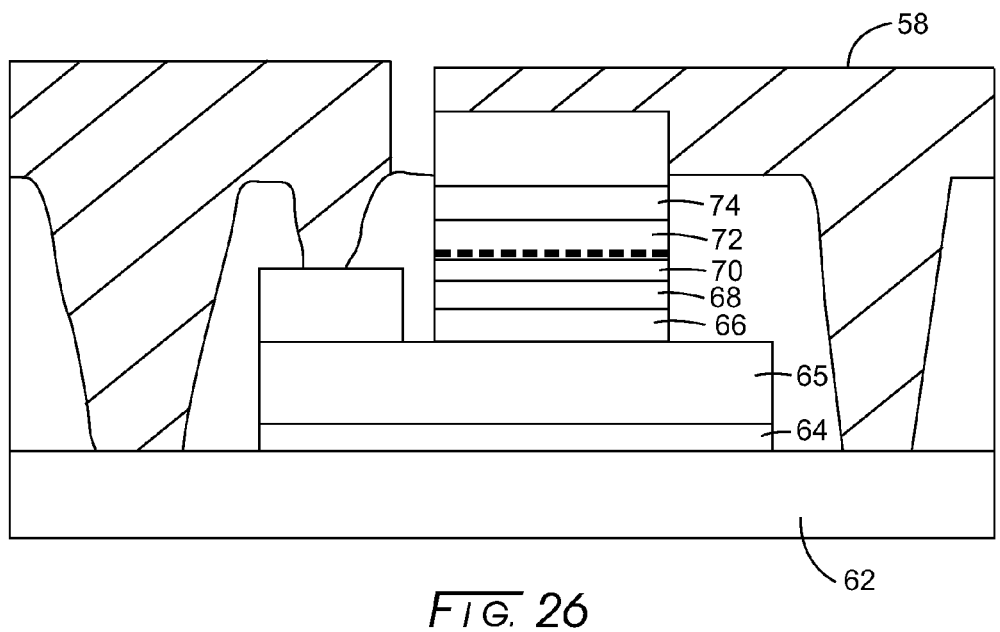
FIG. 26 is a cross-section of a high frequency HBDS of this disclosure.

A device structure (see FIG. 26) has demonstrated noise equivalent powers (NEP) as low as 240 fW/Hz$^{1/2}$.[1] This sensitivity is sufficient to enable passive imaging arrays based on direct detection, without requiring either cryocooling or low-noise amplifier (LNA) front-ends. This reduces not only the cost, but also the front-end engineering needed for arrays based on these materials. Improved noise performance translates directly into improved system signal-to-noise ratio and reduced component part count and complexity. This detection array also involves a DC choke at each pixel. This choke directly converts from intensity-to-DC output on-chip, removing the requirement of transporting THz signals that results in large losses and has historically precluded a number of terahertz applications. HBDS, 58, includes layers: 62, S.I. GaAs substrate; 64, buffer layer; 66, GaSb; 68, $Al_{0.1}Ga_{0.9}Sb$; 70, AlSb; 72, InAs; and 74; InAs.

Prior work by others using custom-grown structures has demonstrated extremely low 1/f noise and an intrinsic sensitivity that exceeds the theoretical limits of thermionic devices (e.g., Schottky diodes, planar-doped barrier diodes). To date, these demonstrations have been limited to W-band and below (<110 GHz). This effort sees the aggressive scaling of deep-submicron devices for extending their frequency range into the THz regime. These nanoscale devices will be integrated with antennas to form broadband FPA arrays that operate in the 100 GHz through THz regime.

Figure 27:
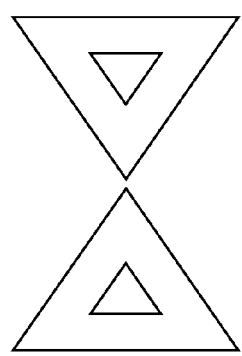
FIG. 27 is terahertz antenna elements for integration with HBDS in a bow-tie antenna configuration.
Figure 28:
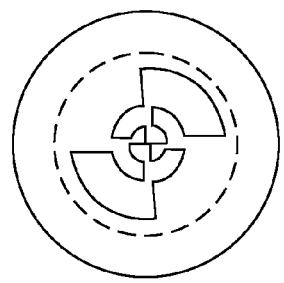
FIG. 28 is terahertz antenna elements for integration with HBDS in a planar log-periodic antenna configuration.
Figure 29:
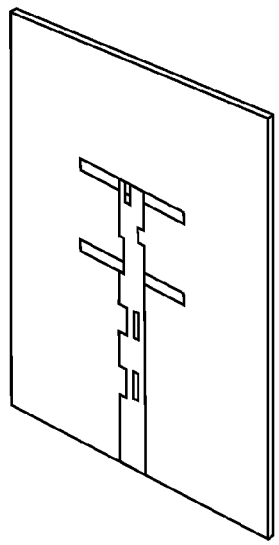
FIG. 29 is terahertz antenna elements for integration with HBDS in a double-slot with microstrip feed antenna configuration.
Figure 30:
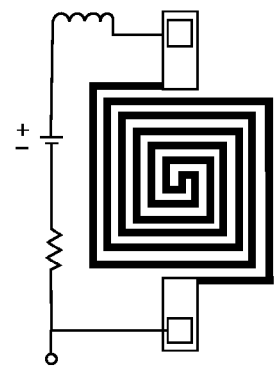
FIG. 30 is terahertz antenna elements for integration with HBDS in a spiral antenna configuration.
Figure 31:
FIG. 31 is terahertz antenna elements for integration with HBDS in a helical antenna configuration.
Figure 32:
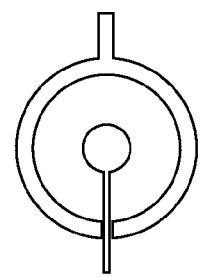
FIG. 32 is terahertz antenna elements for integration with HBDS in a ring antenna configuration.
Figure 33:
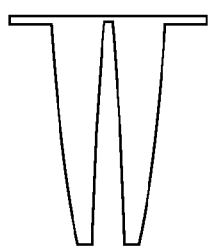
FIG. 33 is terahertz antenna elements for integration with HBDS in a dielectric rod antenna configuration.
Figure 34:
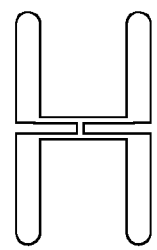
FIG. 34 is terahertz antenna elements for integration with HBDS in a double slot antenna with co-planar waveguide feed antenna configuration.

Work on the present disclosure has already demonstrated a scalable 6×11 FPA monolithically-integrated with matched antenna-diode structures.[1] Several alternative THz antenna architectures shown in FIGS. 27-34. In particular, FIG. 27 is terahertz antenna elements for integration with HBDS in a bow-tie configuration. FIG. 28 is terahertz antenna elements for integration with HBDS in a planar log-periodic configuration. FIG. 29 is terahertz antenna elements for integration with HBDS in a double-slot with microstrip feed configuration. FIG. 30 is terahertz antenna elements for integration with HBDS in a spiral antenna configuration. FIG. 31 is terahertz antenna elements for integration with HBDS in a helical antenna configuration. FIG. 32 is terahertz antenna elements for integration with HBDS in a ring antenna configuration. FIG. 33 is terahertz antenna elements for integration with HBDS in a dielectric rod antenna configuration. Finally, FIG. 34 is terahertz antenna elements for integration with HBDS in a double slot antenna with co-planar waveguide feed configuration.

[1] N. Su, R. Rajavel, P. Deelman, J. N. Schulman, and P. Fay, "Sb-Heterostructure Millimeter-Wave Detectors with Reduced Capacitance and Noise Equivalent Power," *IEEE Electron Device Lett.* 29, no. 6, pp. 536-539, 2008.

Figure 35:
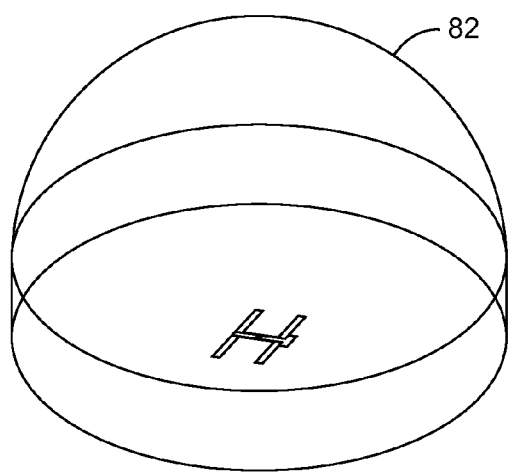
FIG. 35 is a THz antenna detector behind an extended hemispherical lens.
Figure 36:
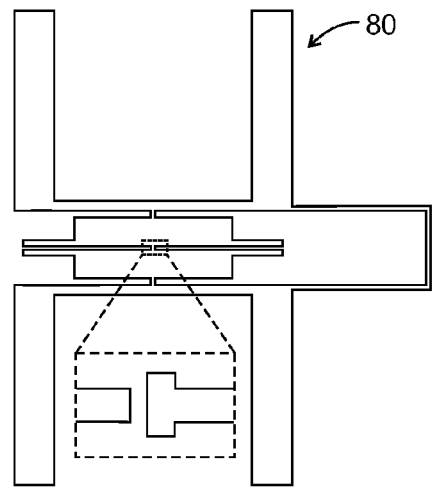
FIG. 36 is a 500 GHz prototype antenna-HBD structure useful in the device of FIGS. 2-5.

After considering the several alternative THz antenna architectures shown in FIGS. 27-34, the antenna design of choice consisted of the double-slot antenna element (FIG. 34) printed on a high-resistivity silicon substrate and tuned to match the HBD's impedance at 0.1 THz. A 0.5 THz prototype has been demonstrated by scaling the design and re-tuning the impedance match to this particular frequency. This single element prototype, 80, shown in FIGS. 35 and 36, is situated behind an extended hemispherical imaging lens, 82.

Figure 37:
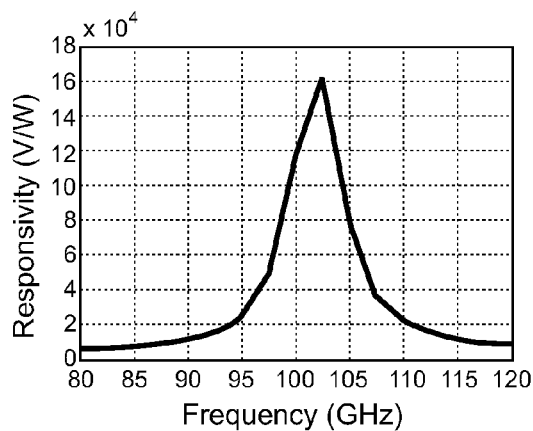
FIG. 37 graphically shows the responsivity of the prototype of FIG. 39.
Figure 38:
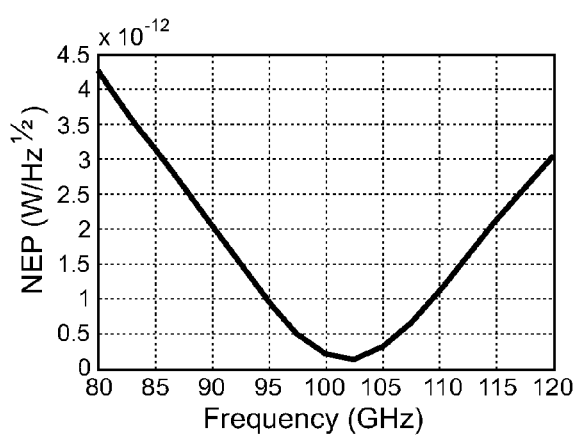
FIG. 38 graphically shows the NEP for 100 GHz of the prototype of FIG. 39.

The integrated antenna-diode is shown in FIGS. 2 and 2A (above), along with the computed receiving pattern of the single element detector. This first prototype was successfully tested using the standard setup shown in FIG. 5. At the design frequency of 0.1 THz, this matched prototype achieved an unprecedented responsivity of R=100,000 V/W, and a noise equivalent power of NEP=0.2×10$^{-12}$ (FIGS. 37 and 38). When scaled to 0.5 THz, the design sustains a responsivity >20,000 V/W with NEP<1×10$^{-12}$. There exists no other detector option offering this performance without a considerable form factor and liquid helium cryocooling requirements.

This monolithic integration of sensor element and antenna allows the designer to flexibly modify the antenna topology. This modification can be done according to well-developed antenna design and microwave matching and filter theory techniques, in order to achieve a perfect match to the complex diode impedance. This highly promising integration of antenna and radiofrequency (RF) engineering is already opening up new avenues to develop a high-efficiency coupling of incident radiation into high-speed non-linear detectors. For example, similar approaches are being pursued to improve sensor responsivity and speed in the infrared (IR) and optical bands (using nano-antennas).

SUMMARY

Disclosed herein is a dual slot antenna with tunable main-beam direction integrated with zero bias Sb-heterostructure backward diode for direct detection of THz radiation. The compact layout and high responsivity of such detector elements make them suitable to design 2D focal plane THz imaging arrays. Further, the disclosure proposed and demonstrated that the number of detectors supported by a fixed size silicon lens can be significantly increased by tuning the main radiation beam of each pixel to illuminate the optical axis. This can simply be achieved by shifting feed locations and/or introducing small parasitic slots into the antenna geometry. In addition, the disclosure demonstrated that double folded slot antennas are promising candidates for dual band THz detection of breast cancer. Improving resolution and enabling multiband detection are current challenges in the THz imaging arrays and can be addressed with the development of smaller antenna/detector topologies, as outlined in this disclosure.

Besides healthcare use of the disclosed detector system, other likely uses include, for example, 1. Biomedical
THz imaging and diagnostics
Cancer detection: Breast, oral, skin, prostate, and cervical
Dental imaging
Skin assessment: Burn diagnostics and dermatology, cosmetic diagnostics and treatment
Orthopedic imaging (of exposed bones)
Ablation: cancer treatment, cosmetic surgery, cosmetic therapeutics
Volatile organic compound detection and spectroscopy
Identifying polymorphs and hydrides in drug compounds
Counter detection of drugs and pharmaceutical
2. Non-Destructive Testing
Microchip inspection
Corrosion identification
Gaseous compound inspection and detection
Pharmaceutical quality control
Package inspection
Wind blade inspection
Jet-propulsion inspection
Material integrity and structural analysis
Fuel cell quality control and diagnostics
Process monitoring
Pollution monitoring
Diagnostics of natural gas pipelines
Detection of separation of laminated materials
Systems for 3D inspection of fragile art products
Molecular recognition and protein folding
3. Security Screening
Checkpoint screening
Concealed contraband detection
Controlled substances detection
Harmful compound identification
Biometrics (gates, hand, walking behavior)
Imaging through fog
Evaluation of agricultural products (imaging of fresh frozen samples, moisture differences, etc.)
4. Telecommunications/Astronomy/Weapons
Line of sight high-speed digital and analog communications, >10 Gbits
Military applications for high speed
Extensions of broadband fiber optics
High magnetic field application
Sub-mmW and mmW astronomy
Atmospheric observations/monitoring (such as ozone depletion)
Guidance and ID systems
Counter riot protection
5. Aviation
Aircraft penetration of dust and fog for improved visibility.

Additional fields of use include, for example, RF/EO/Optics imaging systems, RF/EO/Optics phased arrays, mmW imaging, mmW communications mmW adaptive arrays, mmW smart antennas, and UV Communications/Radios.

While the device and its use have been described with reference to various embodiments, those skilled in the art will understand that various changes may be made and equivalents may be substituted for elements thereof without departing from the scope and essence of the disclosure. In addition, many modifications may be made to adapt a particular situation or material to the teachings of the disclosure without departing from the essential scope thereof. Therefore, it is intended that the disclosure not be limited to the particular embodiments disclosed, but that the disclosure will include all embodiments falling within the scope of the appended claims. In this application all units are in the metric system and all amounts and percentages are by weight, unless otherwise expressly indicated. Also, all citations referred herein are expressly incorporated herein by reference.

REFERENCES

[1] S. M. Hanham, T. V. Bird, B. F. Johnston, R. A. Minasian, "Dielectric Rods for THz Antenna Arrays", *WARS* 2008.
[2] M. C. Kemp et al, "Security Applications of Terahertz Technology", *Proceedings of SPIE*, vol. 5070, 2003.
[3] G. P. Gauthier, W. Y. Ali-Ahmad, T. P. Budka, D. F. Filipovic, and G. M. Rebeiz, "A Uniplanar 90-GHz Schottky-Diode Milimeter-Wave Receiver," *IEEE Transactions on Microwave Theory and Techniques*, vol. 43, no. 7, pp. 1669-1672, July 1995.

[4] D. F. Filipovic, G. P. Gauthier, S. Raman, and G. M. Rebeiz, "Off-Axis Properties of Silicon and Quartz Dielectric Lens Antennas," vol. 45, no. 5, pp. 760-766, May 1997.

[5] N. Su, R. Rajavel, P. Deelman, J. N. Schulman, and P. Fay, "Sb-Heterostructure Millimeter-Wave Detectors With Reduced Capacitance and Noise Equivalent Power," *IEEE Electron Device Letters*, vol. 29, no. 6, pp. 536-539, June 2008.

[6] D. F. Filipovic, S. S. Gearheart, and G. M. Rebeiz, "Double-slot antennas on extended-hemispherical and elliptical silicon dielectric lenses," *IEEE Transactions on Microwave Theory and Techniques*, vol. 41, pp. 1738-1749, October 1993.

We claim:

1. A method of correcting optical aberration for an off-axis detector of a millimeter-wave/terahertz sensor system, comprising:
   providing a hemispherical lens having a focal plane opposite to a curvature of the hemispherical lens, the focal plane being extended away from a center of the hemispherical lens, the center of the hemispherical lens defining an optical axis; and
   providing one or more wideband detectors positioned near the focal plane of the hemispherical lens, each of the one or more detectors respectively comprising an antenna and a sensor element coupled to the antenna; and
   correcting for optical aberrations of at least one of the one or more wideband detectors that is offset by a distance from the optical axis of the hemispherical lens by tilting a radiating pattern of the respective antenna of the at least one of the one or more wideband detectors offset by the distance from the optical axis of the hemispherical lens by an angle and directing the tilted radiation pattern toward the optical axis of the hemispherical lens, wherein a maximum direction of the radiating pattern of the respective antenna of the at least one of the one or more wideband detectors is related to the distance by which the at least one of the one or more wideband detectors is offset from the optical axis of the hemispherical lens.

2. The method of claim 1, wherein the sensor element comprises a non-linear electronic or optical device and providing the one or more wideband detectors comprises providing the respective non-linear electronic or optical device coupled to a planar antenna wherein the non-linear electronic or optical device has an input impedance that is matched with an impedance of the respective planar antenna of the detectors at a selected frequency or a selected range of frequencies.

3. The method of claim 2, wherein the respective sensor of the at least one of the detectors is configured to rectify signals detected by the respective antenna of the at least one of the detectors to a measurable voltage.

4. The method of claim 2, wherein tilting the radiating pattern of the respective antenna of the at least one of the one or more detectors offset by the distance from the optical axis of the hemispherical lens comprises positioning the respective diode of the at least one of the detectors away from a geometric center of the respective antenna of the at least one of the detectors such that the radiating pattern of the respective antenna of the at least one of the detectors is tilted by the angle and directed toward the optical axis of the hemispherical lens.

5. The method of claim 2, wherein tilting the radiating pattern of the respective antenna of the at least one of the one or more detectors offset by the distance from the optical axis of the hemispherical lens comprises the respective antenna of the at least one of the detectors including one or more parasitic elements such that the radiating pattern of the respective antenna of the at least one of the detectors is tilted by a specific fixed angle and directed toward the optical axis of the hemispherical lens over the selected operation frequency or range of frequencies.

6. The method of claim 2, wherein tilting the radiating pattern of the respective antenna of the at least one of the one or more detectors offset by the distance from the optical axis of the hemispherical lens comprises providing a first electric length of a first feed line that couples a first portion of the respective antenna of the at least one of the detectors to the respective sensor of the at least one of the detectors that is longer than a second electric length of a second feed line that couples a second portion of the respective antenna of the at least one of the detectors to the respective sensor of the at least one of the detectors such that the radiating pattern of the respective antenna of the at least one of the detectors is tilted by the angle and directed toward the optical axis of the hemispherical lens.

7. The method of claim 2, wherein the radiating pattern of the respective antenna of the at least one of the detectors is tilted by the angle and directed toward the optical axis of the hemispherical lens by one or more of:
   a position of the respective sensor of the at least one of the detectors with respect to the respective antenna of the at least one of the detectors being different in a first direction, a second direction, or both a first and second direction as compared to a position of the respective sensor of one of the detectors aligned with the optical axis of the hemispherical lens with respect to the respective antenna of the one of the detectors aligned with the optical axis of the hemispherical lens,
   an electric length of a feed line coupling the respective antenna of the at least one of the detectors to the respective sensor of the at least one of the detectors being longer than an electric length of a feed line coupling the respective antenna of the one of the detectors aligned with the optical axis of the hemispherical lens to the respective sensor of the one of the detectors aligned with the optical axis of the hemispherical lens, and
   the respective antenna of the at least one of the detectors including one or more parasitic slots not included in the respective antenna of the one of the detectors aligned with the optical axis of the hemispherical lens.

8. The method of claim 2, wherein the one or more wideband detectors are configured to detect signals with frequencies between a radiofrequency band and an infrared or optical band.

9. The method of claim 1, wherein providing one or more wideband detectors includes one or more of the detectors comprising an antenna with a bow-tie antenna configuration, a planar log-periodic antenna configuration, a double-slot with microstrip feed antenna configuration, a spiral antenna configuration, a helical antenna configuration, a ring antenna configuration, a dielectric rod antenna configuration, or a double slot antenna with co-planar waveguide feed configuration.

10. The method of claim 1, wherein providing one or more wideband detectors comprises providing one or more wideband detectors wherein a size of the respective antenna of the at least one of the detectors is selected based on a diffraction limit of an aperture of the hemispherical lens.

11. The method of claim 1, wherein providing one or more wideband detectors positioned near the focal plane of the hemispherical lens comprises providing the one or more wideband detectors arranged on a focal plane array that is positioned near a surface opposite to the curvature of the hemispherical lens.

12. The method of claim 11, wherein the one or more wideband detectors arranged on the focal plane array include single band detectors, broad band detectors, or a combination of single band and broad band detectors.

13. The method of claim 11, wherein the focal plane array is planar.

14. The method of claim 1, wherein providing the one or more wideband detectors positioned near the focal plane of the hemispherical lens, each of the one or more detectors respectively comprising an antenna and a sensor element coupled to the antenna comprises providing one or more wideband detectors where the sensor element of each of the one or more wideband detectors comprises a diode or a non-linear millimeter-wave/THz frequency electronic or optical device.

* * * * *